United States Patent
Wu et al.

(10) Patent No.: US 7,593,262 B2
(45) Date of Patent: Sep. 22, 2009

(54) MEMORY STRUCTURE AND OPERATING METHOD THEREOF

(75) Inventors: Chao-I Wu, Tainan (TW); Ming-Hsiang Hsueh, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 234 days.

(21) Appl. No.: 11/637,155

(22) Filed: Dec. 12, 2006

(65) Prior Publication Data

US 2008/0137407 A1 Jun. 12, 2008

(51) Int. Cl.
*G11C 16/04* (2006.01)

(52) U.S. Cl. .................. 365/185.14; 365/185.18; 365/185.24

(58) Field of Classification Search ............ 365/185.14, 365/185.24, 185.18
See application file for complete search history.

(56) References Cited

U.S. PATENT DOCUMENTS 6,081,453 A * 6/2000 Iwahashi ............... 365/185.22
7,382,660 B2 * 6/2008 Bovino et al. .......... 365/185.28
2004/0095809 A1 * 5/2004 Sakamoto et al. ....... 365/185.29

FOREIGN PATENT DOCUMENTS

CN 1393934 A 1/2003

OTHER PUBLICATIONS

Hiromi Nobukata et al. A 144Mb 8-Level NAND Flash Memory with Optimized Pulse Width Programming Pub. Date, Jun. 30, 1999 pp. 39-40.

* cited by examiner

*Primary Examiner*—Tuan T Nguyen
*Assistant Examiner*—Hien N Nguyen
(74) *Attorney, Agent, or Firm*—Birch, Stewart, Kolasch & Birch, LLP

(57) ABSTRACT

A method for operating memory used for enabling the memory device to have a first threshold voltage or a second threshold voltage is provided. The method includes the following procedures. First, an operating voltage is applied to a gate of the memory device for a first time period, such that the memory device has the first threshold voltage. Next, the same operating voltage is applied to the gate of the memory for a second time period, such that the memory device has a second threshold voltage. The duration of the first time period is different from the duration of the second time period.

20 Claims, 3 Drawing Sheets

MEMORY STRUCTURE AND OPERATING METHOD THEREOF

BACKGROUND OF THE INVENTION

1. Field of the Invention

The invention relates in general to a memory structure and operating method thereof, and more particularly to a memory structure that can operate with single voltage.

2. Description of the Related Art

According to conventional memory device, an operating voltage is applied to the gate of the memory device for injecting a hole or an electron to the charge trapping layer of the memory device to change threshold voltage such that the memory device has a programming state. When a read voltage is applied for reading, a bit state, such as "0" or "1", is obtained. When data is to be erased, another operating voltage is applied to the gate of the memory device for excluding the hole or electron from the charge trapping layer of the memory device or taking complementary charge carrier from the bottom substrate to neutralize the trapped electron or hole, such that the threshold voltage is restored to an erasing state. Thus, when a read voltage is used for reading, another bit state is obtained.

However, the above operation of the memory device requires the memory device to be able to apply two different operating voltages to the gate, further increasing complexity of design and operation of the memory device.

SUMMARY OF THE INVENTION

It is therefore an object of the invention to provide a memory structure and operating method thereof. When a specific memory structure is employed, a single voltage can be used to enable the memory device to have different threshold voltages corresponding to different bit states.

The invention achieves the above-identified object by providing a method for operating memory used for enabling the memory device to have a first threshold voltage or a second threshold voltage. The method includes the following procedures. First, an operating voltage is applied to the gate of the memory device for a first time period, such that the memory device has the first threshold voltage. Next, the same operating voltage is applied to the gate of the memory for a second time period, such that the memory device has a second threshold voltage. The duration of the first time period is different from the duration of the second time period.

The invention achieves another object by providing a memory structure. The memory structure includes a substrate, a bottom oxide layer, a charge trapping layer, a top oxide layer and a gate. The substrate includes a channel, a source and a drain. The source and the drain are respectively located at two sides of the channel. The bottom oxide layer is disposed on the channel. The charge trapping layer is disposed on the bottom oxide layer. The top oxide layer is disposed on the charge trapping layer. The gate is disposed on the top oxide layer. The bottom oxide layer has a specific thickness such that when an operating voltage is applied to the gate for a first time period, the memory structure has a first threshold voltage. When the same operating voltage is applied to the gate for a second time period different from the first time period, the memory structure has a second threshold voltage Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
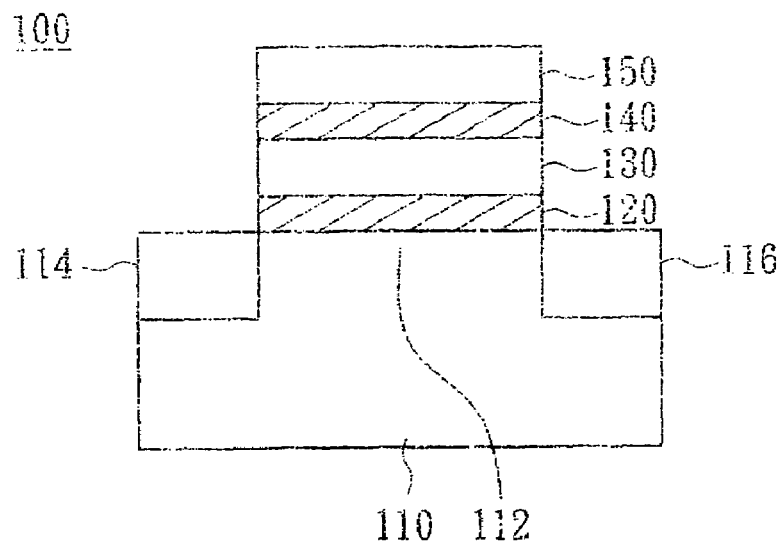
FIG. 1 is a cross-section of a memory structure according to a preferred embodiment of the invention.

Referring to FIG. 1, a cross-section of a memory structure according to a preferred embodiment of the invention is shown. The memory structure 100 includes a substrate 110, a bottom oxide layer 120, a charge trapping layer 130, a top oxide layer 140 and a gate 150. The substrate 110 includes a channel 112, a source 114 and a drain 116. The source 114 and the drain 116 are respectively located at two sides of the channel 112. The bottom oxide layer 120 is disposed on the channel 112. The bottom oxide layer 120 has a specific thickness within the range of 30 angstroms (Å)~40 angstroms (Å). The charge trapping layer 130 is disposed on the bottom oxide layer 120. The top oxide layer 140 is disposed on the charge trapping layer 130. The gate 150 is disposed on the top oxide layer 140. The thickness of the charge trapping layer 130 is within the range of 70 Å~200 Å, and the charge trapping layer 130 can be made from silicon nitride or aluminum oxide. The compositions of silicon nitride include standard silicon nitride ($Si_3N_4$) and Si-rich silicon nitride. The thickness of the top oxide layer is within the range of 70 Å~100 Å. The bottom oxide layer 120 and the top oxide layer 140 can be made from silicon oxide. The gate 150 can be made from metal, P-type poly-silicon or N-type poly-silicon. When an operating voltage is applied to the gate 150 for a first time period, the memory structure 100 has a first threshold voltage. When the operating voltage is applied for a second time period different from the first time period, the memory structure 100 has a second threshold voltage.

When the substrate 110 is a P-type substrate with P dopants, and the source 114 and the drain 116 has N-type dopants such that the channel 112 is an N-type channel with electrons as the majority of the flowing carriers. When the substrate 110 is a N-type substrate with N dopants, and the source 114 and the drain 116 has P-type dopants such that the channel 112 is a P-type channel with holes as the majority of the flowing carriers.

When the thickness of the bottom oxide layer 120 of the memory structure 100 is within the range of 30 Å~40 Å, the following operating procedures can be performed. The present embodiment of the invention is exemplified by a memory structure with a P-type substrate and an N-type channel. When the memory structure 100 is at an erasing state and has a first threshold voltage, that is, when a read voltage larger than the first threshold voltage is applied to the gate 150 of the memory structure 100, and a fixed bias voltage is applied to the source 114 and the drain 116, a reading current passing through the channel 112 is detected and the bit state is defined as "1" according to the present embodiment of the invention. When the memory structure 100 is at a programming state and has a second threshold voltage, that is, when a read voltage smaller than the second threshold voltage is applied to the gate 150 of the memory structure 100, and a fixed bias voltage is applied to the source 114 the drain 116, no significant reading current is detected and the bit state is defined as "0" according to the present embodiment of the invention. The bit state can be defined reversely, and the exemplification of the definition of the bit state is not for limiting the invention.

Figure 2:
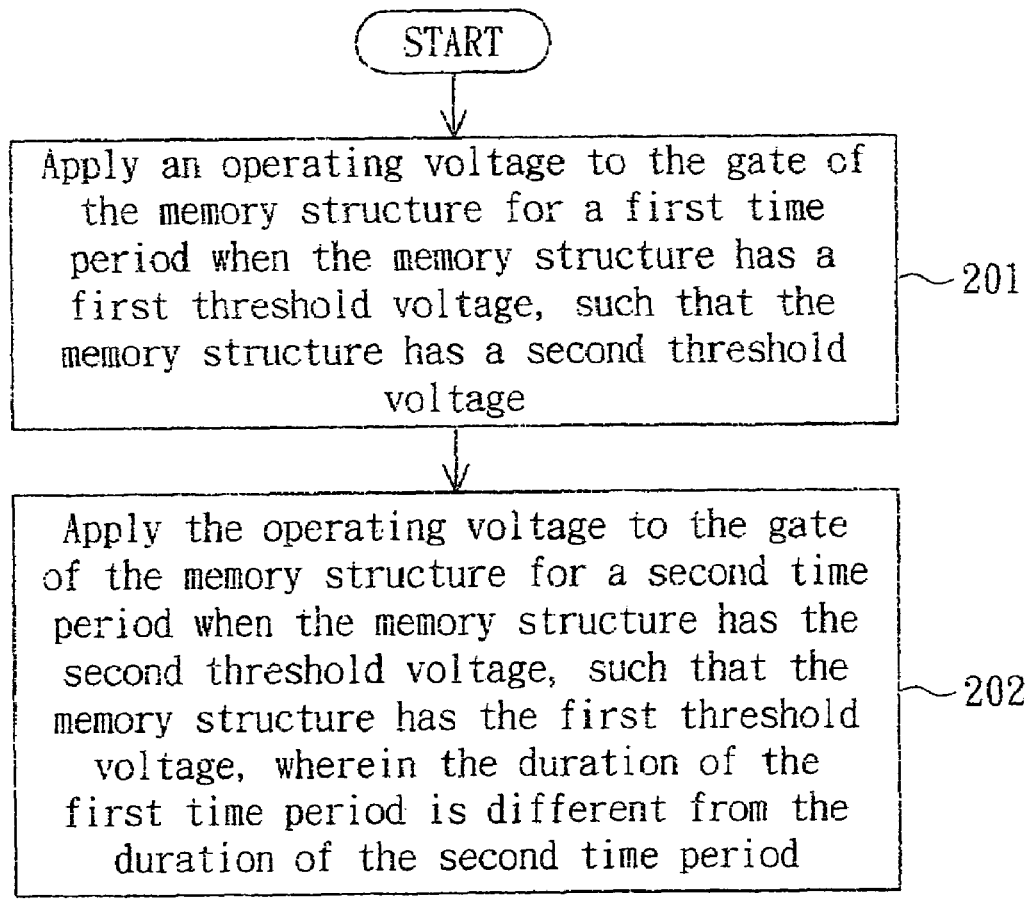
FIG. 2 is a flowchart of method for operating a memory device of the invention.

Referring to FIG. 2, a method for operating a memory device of the invention is shown. Also referring to the memory structure 100 of FIG. 1. First, the method begins at step 201, when the memory structure 100 has a first threshold voltage, the bit state of the memory structure 100 is "1". Meanwhile, an operating voltage is applied to the gate 150 of the memory structure 100. When the channel 112 of the memory structure 100 of the present embodiment of the invention is an N-type channel, the operating voltage is within the range of −16V~−22V. When the operating voltage is applied for a first time period, the electrons is injected into the charge trapping layer such that the memory structure 100 has a second threshold voltage, and the bit state of the memory structure 100 "0". When the channel 112 is a P-type channel, the operating voltage is within the range of 16V~22V so as to inject the holes into the charge trapping layer 130.

The method proceeds to step 202, when the memory structure 100 has a second threshold voltage, the same operating voltage is applied to the gate 150 of the memory structure 100. After the operating voltage is applied for a second time period, the memory structure 100 restores the first threshold voltage. The duration of the first time period is different from the duration of the second time period. In the present embodiment of the invention, the first time period corresponds to the programming operation of injecting electrons to the memory structure 100 and has a shorter duration; the second time period corresponds to the erasing operation of excluding (or neutralizing) the electrons trapped by the memory structure 100 and has a longer duration. Because the duration of the operating voltage applied is longer, the electrons trapped in the charge trapping layer are excluded or neutralized such that the threshold voltage of memory structure 100 decreases. If the channel 112 is a P-type channel, the range of the operating voltage is within 16V~22V. It results that redudat holes are excluded or neutralized.

That is, step 201 is a programming operation of the memory device, and step 202 is an erasing operation of the memory device. Therefore, step 201 and step 202 can be repeated to operate the memory at a programming state or an erasing state.

Figure 3:
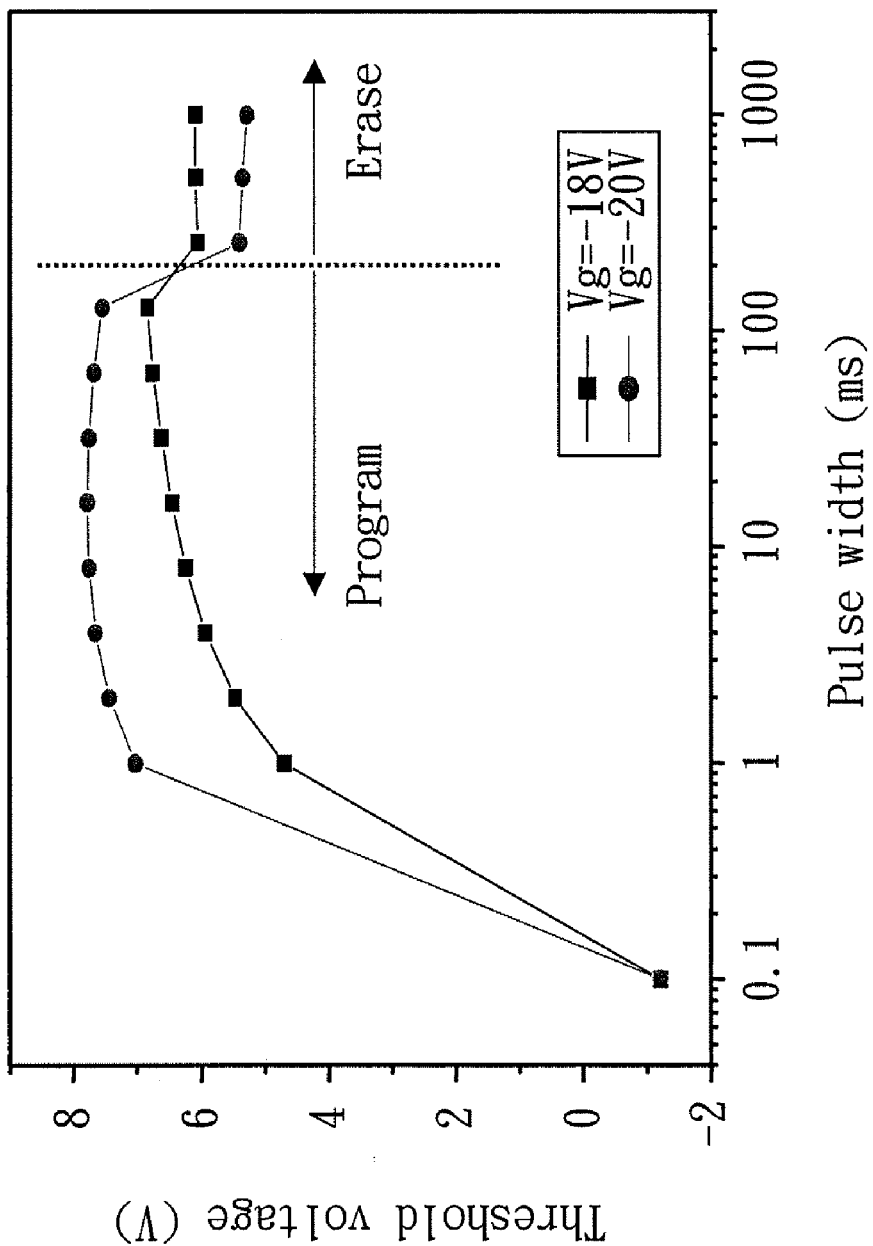
FIG. 3 is a diagram showing the relationship between the levels of threshold voltage and pulse width of a memory structure of the invention at different operating voltages.

Referring to FIG. 3, a diagram showing the relationship between the levels of threshold voltage and pulse width of a memory structure of the invention at different operating voltages is shown. As is indicated in FIG. 3, when an operating voltage is applied to the memory structure, the threshold voltage increases as the pulse width increases, and gradually approaches a stable level. If the operating voltage is cut off, the memory structure will retain at a relatively higher level of threshold voltage. When the pulse width for applying a voltage is larger than a pre-determined time interval, the threshold voltage will suddenly step down and retain at a relatively lower level. Such feature enables using a single voltage to perform programming and erasing operations to the memory device. It is also noted in FIG. 3 that when a higher operating voltage Vg is adopted, the programming state and the erasing state have a wider gap in the threshold voltage, and the operation window of the memory device is increased.

Figure 4:
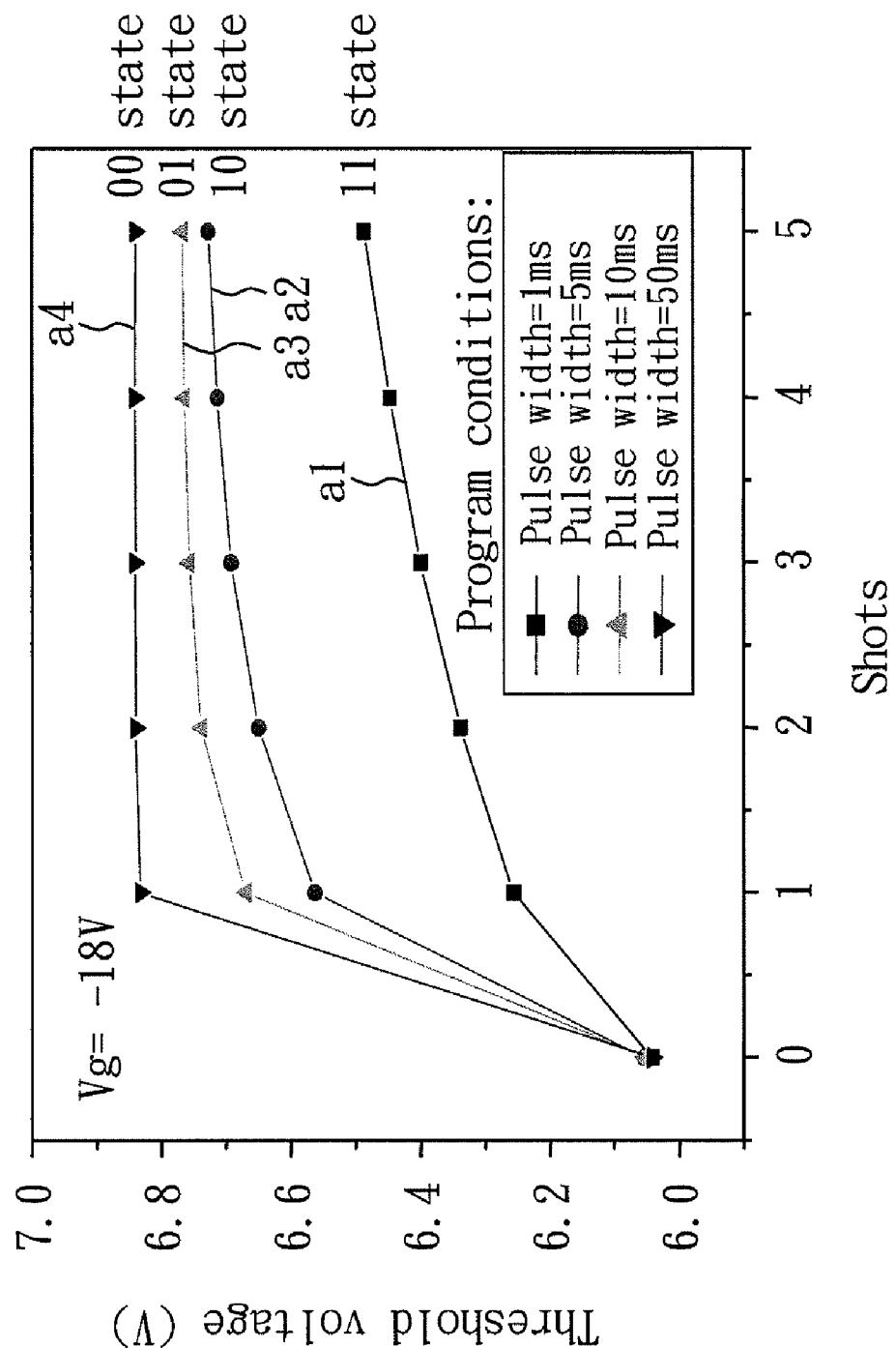
FIG. 4 is a diagram showing the relationship between the levels of threshold voltage and the number of pulse shots of a memory structure of the invention at different pulse widths.

Referring to FIG. 4, a diagram showing the relationship between the levels of threshold voltage and the number of pulse shots of a memory structure of the invention at different pulse widths. As indicated in the drawing, when a single operating voltage is retained with the same pulse shots, different pulse widths will result in different threshold voltages, and such feature makes the embodiment of a multi-level cell (MLC) memory device realize. For example, in FIG. 4, when the operating voltage is set to be fixed at Vg=−18V, four different durations of pulse width are applied to the gate of the memory device for the memory device to achieve four threshold voltages. That is, when a fixed reading voltage is applied to the gate for reading, the bit state of the memory device is determined with reference to the reading current. For example, when the pulse shot is 1, and a fixed reading voltage is applied, in the condition of the memory device having respective threshold voltages corresponding to the curves a1, a2, a3, a4, corresponding threshold currents can be measured respectively. When the reading current is larger than the threshold current corresponding to curve a1, the bit state of the memory device is defined as "11". When the reading current is smaller than the threshold current corresponding to curve a1 but is larger than the threshold current corresponding to curve a1 but is larger than the threshold current corresponding to the curve a2, the bit state of the memory device is defined as "10". When the reading current is smaller than the threshold current corresponding to the curve a2 but is larger than the threshold current corresponding to the curve a3, the bit state of the memory device is defined as "01". When the reading current is smaller than the threshold current corresponding to the curve a3 but is larger than the threshold current corresponding to the curve a4, the bit state of the memory device is defined as "00". Therefore, 2 bits data can be recorded in a single memory unit. The memory structure capable of storing more bits can be embodied if more threshold voltages are produced by applying different pulse widths and the ranges of the reading currents corresponding to the threshold voltages can be determined accordingly.

According to the method for operating a memory structure and operating method thereof disclosed in the above embodiments of the invention, when a single operating voltage is retained and different pulse widths are applied to the gate, the memory structure has different threshold voltages, hence achieving a multi-level cell (MLC) memory device. When the data is to be erased, the erasing state can be resorted by applying the same operating voltage for a longer duration. That is, under a single voltage, by controlling the pulse width, the program and erase operations of memory device can be performed. A novel memory structure and operating method thereof provided in the invention can ease the design complexity for memory applications and increase the range of application thereof.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for operating memory and enabling a memory structure to have a first threshold voltage or a second threshold voltage, the method comprising:
   (a) applying an operating voltage to a gate of the memory structure for a first time period when the memory structure has the first threshold voltage, such that the memory structure has the second threshold voltage;

(b) applying the same operating voltage to the gate of the memory structure for a second time period when the memory structure has the second threshold voltage, such that the memory structure has the first threshold voltage, wherein the duration of the first time period is different from the duration of the second time period.

2. The operating method according to claim 1, wherein the memory structure has a top oxidation layer, a charge trapping layer and a bottom oxidation layer.

3. The operating method according to claim 2, wherein the thickness of the bottom oxide layer is within the range of 30 angstroms (Å)~40 angstroms (Å).

4. The operating method according to claim 2, wherein the thickness of the charge trapping layer is within the range of 70 Å~200 Å.

5. The operating method according to claim 2, wherein the thickness OT the top oxide layer is within the range of 70 Å~100 Å.

6. The operating method according to claim 1, wherein the memory structure has an N-type channel.

7. The operating method according to claim 6, wherein the operating voltage is within the range of −16V~−22V.

8. The operating method according to claim 1 wherein the memory structure has a P-type channel.

9. The operating method according to claim 8, wherein the operating voltage is within the range of 16V~22V.

10. A memory structure, comprising:
   a substrate, comprising:
      a channel; and
      a source and a drain respectively located at two sides of the channel;
   a bottom oxide layer disposed on the channel;
   a charge trapping layer disposed on the bottom oxidation layer;
   a top oxide layer disposed on the charge trapping layer, and
   a gate disposed on the top oxide layer;
   wherein the bottom oxide layer has a specific thickness such that when an operating voltage is applied to the gate for a first time period, the memory structure has a first threshold voltage, and when the same operating voltage is applied to the gate for a second time period different from the first time period, the memory structure has a second threshold voltage.

11. The memory structure according to claim 10, wherein the thickness of the bottom oxide layer is within the range of 30 Å~40 Å.

12. The memory structure according to claim 10, wherein the thickness of the charge trapping layer is within the range of 70 Å~200 Å.

13. The memory structure according to claim 10, wherein the thickness of the top oxide layer is within the range of 70 Å~100 Å.

14. The memory structure according to claim 10, wherein the substrate is a P-type substrate.

15. The memory structure according to claim 14, wherein the source and the drain has N-type dopants.

16. The memory structure according to claim 10, wherein the substrate is an N-type substrate.

17. The memory structure according to claim 16, wherein the source and the drain has P-type dopants.

18. The memory structure according to claim 10, wherein the charge trapping layer is made from silicon nitride or aluminum oxide.

19. The memory structure according to claim 10, wherein the gate is made from metal, P-type poly-silicon or N-type poly-silicon.

20. The memory structure according to claim 10, wherein the bottom oxide layer and the top oxide layer is made from silicon oxide.

* * * * *